(12) United States Patent
Guevara et al.

(10) Patent No.: US 11,864,471 B2
(45) Date of Patent: Jan. 2, 2024

(54) SEMICONDUCTOR DEVICE WITH PASSIVATED MAGNETIC CONCENTRATOR

(71) Applicant: Texas Instruments Incorporated, Dallas, TX (US)

(72) Inventors: Rafael Jose Lizares Guevara, Manila (PH); Dok Won Lee, Mountain View, CA (US); Kashyap Mohan, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 42 days.

(21) Appl. No.: 17/514,820

(22) Filed: Oct. 29, 2021

(65) Prior Publication Data

US 2023/0135922 A1    May 4, 2023

(51) Int. Cl.
| | |
|---|---|
| *G01R 33/00* | (2006.01) |
| *H10N 52/80* | (2023.01) |
| *G01R 33/07* | (2006.01) |
| *H10N 50/85* | (2023.01) |
| *H10N 52/01* | (2023.01) |
| *H10N 52/00* | (2023.01) |

(52) U.S. Cl.
CPC ......... *H10N 52/80* (2023.02); *G01R 33/0011* (2013.01); *G01R 33/07* (2013.01); *H10N 50/85* (2023.02); *H10N 52/01* (2023.02); *H10N 52/101* (2023.02)

(58) Field of Classification Search
CPC ... G01R 33/0011; G01R 33/07; H01L 43/065; H01L 43/10; H01L 43/14; H01L 43/04
See application file for complete search history.

(56) References Cited

U.S. PATENT DOCUMENTS

| | | | |
|---|---|---|---|
| 2009/0309590 A1* | 12/2009 | Kataoka | H01L 27/22 257/E21.09 |
| 2013/0249029 A1* | 9/2013 | Vig | G01R 33/0047 257/427 |

(Continued)

OTHER PUBLICATIONS

Datasheet, "DRV5053 Analog-Bipolar Hall Effect Sensor", Texas Instruments Incorporated, May 2014—Revised Dec. 2015, retrieved from url: https://www.ti.com/lit/ds/symlink/drv5053.pdf on Oct. 29, 2021.

*Primary Examiner* — Dominic E Hawkins
(74) *Attorney, Agent, or Firm* — Yudong Kim; Frank D. Cimino (57) ABSTRACT

A described example includes: a semiconductor die including a Hall sensor arranged in a first plane that is parallel to a device side surface of the semiconductor die; a passivated magnetic concentrator including a magnetic alloy layer formed over the device side surface of the semiconductor die, the upper surface of the magnetic alloy layer covered by a layer of polymer material; a backside surface of the semiconductor die opposite the device side surface mounted to a die side surface of a die pad on a package substrate, the semiconductor die having bond pads on the device side surface spaced from the magnetic concentrator; electrical connections coupling the bond pads of the semiconductor die to leads of the package substrate; and mold compound covering the magnetic concentrator, the semiconductor die, the electrical connections, a portion of the leads, and the die side surface of the die pad.

22 Claims, 9 Drawing Sheets

(56) References Cited

U.S. PATENT DOCUMENTS

| | | | |
|---|---|---|---|
| 2015/0140736 A1* | 5/2015 | Pendse | H01L 24/92 438/109 |
| 2015/0380376 A1* | 12/2015 | Mathew | H01L 23/49582 257/676 |
| 2017/0184636 A1* | 6/2017 | Racz | H01L 43/06 |
| 2020/0371168 A1* | 11/2020 | Van Der Wiel | G01R 33/0011 |

* cited by examiner

SEMICONDUCTOR DEVICE WITH PASSIVATED MAGNETIC CONCENTRATOR

TECHNICAL FIELD

This relates generally to semiconductor devices that sense magnetic fields, and more particularly to semiconductor devices with Hall sensors.

BACKGROUND

Semiconductor devices for magnetic sensing include Hall effect sensors with circuitry. Magnetic sensing can be used for motor control, position sensing, automation, current sensing and other applications. Hall effect sensors integrated in silicon semiconductor devices can be formed by doping regions to include carriers that are sensitive to a magnetic field. A voltage proportional to a magnetic field is output while a constant current is applied to the Hall sensor. The Hall sensor is most sensitive to magnetic fields normal to a plane in the sensor. In an application using a Hall sensor with directional sensitivity, the semiconductor device position is critical to sensing the magnetic field, to ensure the magnetic field is normal to the sensor within the semiconductor device. Alignment and system positions are critical to the performance of the sensor.

Performance for sensing magnetic fields when magnetic field is "in plane" with a plane the Hall sensors lie in can be improved by incorporating a magnetic concentrator in the semiconductor device. The magnetic concentrator can be a ferromagnetic material that is formed over the sensor in the semiconductor device. The magnetic concentrator can concentrate and bend the magnetic field, so that when the sensor is exposed to an in plane magnetic field, a local field perpendicular to the Hall sensor is formed within the semiconductor device, so that the sensitivity is improved to in plane magnetic fields.

Magnetic concentrator materials for use in semiconductor processes include magnetic alloy materials. These materials can be deposited, for example, by electroless or electroplating. Magnetic alloy materials are particularly sensitive to often used semiconductor etch and clean chemicals, so that manufacturing magnetic concentrators using these materials in a semiconductor process is difficult. Chemicals used in photolithography and post plating processes can damage the magnetic alloy materials, so that modified chemistries are sometimes specified, increasing costs. A reliable and robust integrated magnetic concentrator, and methods for making it, are needed.

SUMMARY

A described example includes: a semiconductor die including a Hall sensor arranged in a first plane that is parallel to a device side surface of the semiconductor die; a passivated magnetic concentrator including a magnetic alloy layer formed over the device side surface of the semiconductor die, the upper surface of the magnetic alloy layer covered by a layer of polymer material; a backside surface of the semiconductor die opposite the device side surface mounted to a die side surface of a die pad on a package substrate, the semiconductor die having bond pads on the device side surface spaced from the magnetic concentrator; electrical connections coupling the bond pads of the semiconductor die to leads of the package substrate; and mold compound covering the magnetic concentrator, the semiconductor die, the electrical connections, a portion of the leads, and the die side surface of the die pad.

DETAILED DESCRIPTION

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor die" is used herein. A semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, sensors, or active devices such as transistors. The semiconductor die can be an integrated circuit with hundreds or thousands of transistors coupled to form a functional circuit, for example a microprocessor or memory device.

The term "semiconductor device package" is used herein. A semiconductor device package has at least one semiconductor die electrically coupled to terminals, and has a package body that protects and covers the semiconductor die. In some arrangements, multiple semiconductor dies can be packaged together. For example, a power metal oxide semiconductor (MOS) field effect transistor (FET) semiconductor die and a logic semiconductor die (such as a gate driver die or a controller die) can be packaged together to from a single packaged electronic device. Additional components such as passives can be included in the packaged electronic device. The semiconductor die is mounted to a package substrate that provides conductive leads, a portion of the conductive leads form the terminals for the packaged device. The semiconductor die can be mounted to the package substrate with a device side surface facing away from the substrate and a backside surface facing and mounted to a die pad of the package substrate. In wire bonded semiconductor device packages, bond wires couple conductive leads of a package substrate to bond pads on the semiconductor die. The semiconductor device package can have a package body formed by a thermoset epoxy resin in a molding process, or by the use of epoxy, plastics, or resins that are liquid at room temperature and are subsequently cured. The package body may provide a hermetic package for the packaged device. The package body may be formed in a mold using an encapsulation process, however, a portion of the leads of the package substrate are not covered during encapsulation, these exposed lead portions provide the terminals for the semiconductor device package.

The term "package substrate" is used herein. A package substrate is a substrate arranged to receive a semiconductor die and to support the semiconductor die in a completed semiconductor device package. Package substrates useful with the arrangements include conductive lead frames, which can be formed from copper, aluminum, stainless steel, steel and alloys such as Alloy 42 and copper alloys. The lead frames can include a die pad with a die side surface for mounting a semiconductor die, and conductive leads arranged near and spaced from the die pad for coupling to bond pads on the semiconductor die using wire bonds, ribbon bonds, or other conductors. The lead frames can be provided in strips or arrays. The conductive lead frames can be provided as a panel with strips or arrays of unit device portions in rows and columns. Semiconductor dies can be placed on respective unit device portions within the strips or arrays. A semiconductor die can be placed on a die pad for each packaged device, and die attach or die adhesive can be used to mount the semiconductor dies to the lead frame die pads. In wire bonded packages, bond wires can couple bond pads on the semiconductor dies to the leads of the lead frames. The lead frames may have plated portions in areas designated for wire bonding, for example silver plating can be used. After the bond wires are in place, a portion of the package substrate, the semiconductor die, and at least a portion of the die pad can be covered with a protective material such as a mold compound.

A package substrate, such as a lead frame, will have conductive portions on a die side surface. Leads of a metal lead frame are conductive all along the surfaces, while for other substrate types, conductive lands in dielectric substrate material are arranged for connecting to the semiconductor die. Plating to enhance bond wire adhesion, prevent corrosion and tarnish, and increase reliability can be used on leads of conductive lead frames. Spot plating or overall plating can be used.

In packaging semiconductor devices, mold compound may be used to partially cover a package substrate, to cover the semiconductor die, and to cover the electrical connections from the semiconductor die to the package substrate. This can be referred to as an "encapsulation" process, although some portions of the package substrates are not covered in the mold compound during encapsulation, for example terminals and leads are exposed from the mold compound. Encapsulation is often a compressive molding process, where thermoset mold compound such as resin epoxy can be used. A room temperature solid or powder mold compound can be heated to a liquid state and then molding can be performed by pressing the liquid mold compound into a mold. Transfer molding can be used. Unit molds shaped to surround an individual device may be used, or block molding may be used, to form the packages simultaneously for several devices from mold compound. The devices can be provided in an array of several, hundreds or even thousands of devices in rows and columns that are molded together. After the molding, the individual packaged devices are cut from each other in a sawing operation by cutting through the mold compound and package substrate in saw streets formed between the devices. Portions of the package substrate leads are exposed from the mold compound package to form terminals for the packaged semiconductor device.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and the saw will traverse the molded electronic devices in two different directions to cut apart the packaged electronic devices from one another in the array.

The term "quad flat no-lead" or "QFN" is used herein for a type of electronic device package. A QFN package has conductive leads that are coextensive with the sides of a molded package body, and in a quad package the leads are on four sides. Alternative flat no-lead packages may have leads on two sides or only on one side. These can be referred to as "small outline no-lead" or "SON" packages. No-lead packaged electronic devices can be surface mounted to a board. Leaded packages can be used with the arrangements where the leads extend away from the package body and are shaped to form a portion for soldering to a board. A dual in line package (DIP) can be used with the arrangements. A small outline package (SOP) can be used with the arrangements. Small outline no-lead (SON) packages can be used, and a small outline transistor (SOT) package is a leaded package that can be used with the arrangements. Leads for leaded packages are arranged for solder mounting to a board. The leads can be shaped to extend towards the board, and form a mounting surface. Gull wing leads, J-leads, and other lead shapes can be used. In a DIP package, the leads end in pin shaped portions that can be inserted into conductive holes formed in a circuit board, and solder is used to couple the leads to the conductors within the holes.

The term "magnetic alloy" is used herein. A magnetic alloy is a material that is ferromagnetic. Useful examples for the arrangements include nickel iron alloy NiFe, cobalt iron alloy (CoFe), and cobalt or nickel based ternary and quaternary alloys, such as CoFeB, CoNiFe, and CoNiFeCr. In the arrangements, a magnetic concentrator is formed by using a magnetic alloy formed over a semiconductor die including one or more Hall sensors. The magnetic concentrator produces a local magnetic field in response to an applied field. The applied field may be in the same plane as the plane that the Hall sensor or sensors lie in, or "in plane." The magnetic concentrator produces the local field that is out of plane, at an angle with respect to the plane of the Hall sensor or sensors. The magnetic concentrator also concentrates the magnetic flux in the local magnetic field, increasing the sensitivity of the Hall sensor or sensors to the applied magnetic field.

The term "in plane" is used herein to describe a magnetic field. In the arrangements, a semiconductor die includes Hall sensors. In an example a silicon semiconductor die includes Hall sensors formed by creating areas in the semiconductor die that have carriers which, in the presence of an applied magnetic field while a constant current is applied to the Hall sensors, output a voltage proportional to the strength of the magnetic field. The Hall sensor or sensors are arranged along a plane, for example a plane that is parallel to the device side surface of the semiconductor die. The Hall sensors are sensitive to magnetic fields that have flux lines that are "out of plane", at an angle to the plane of the Hall sensors, and preferably normal to the plane the Hall sensors lie in. The Hall sensors are insensitive to magnetic fields with flux lines that are "in plane", or that produce flux parallel to the plane the Hall sensors lie in.

The term "magnetic concentrator" is used herein. A magnetic concentrator is a magnetic element that produces a local magnetic field, and concentrates the flux, in response to an applied magnetic field. In the arrangements, the magnetic concentrators are formed of a magnetic alloy layer, for example a nickel iron (NiFe) magnetic alloy, other magnetic alloys can be used. When an in plane magnetic field is applied to the magnetic concentrator, a local magnetic field is produced with flux lines that are out of plane with respect to Hall sensors in a semiconductor die. The magnetic concentrator also boosts the magnetic field for applied magnetic fields that are in plane, increasing the signal to noise ratio and thereby increasing the sensitivity of the Hall sensor or sensors that are in the semiconductor die. The term "passivated magnetic concentrator" is used herein. A passivated magnetic concentrator is a magnetic concentrator at least partially covered with a polyimide layer. In example arrangements, a magnetic concentrator is formed of a magnetic alloy layer, and is then passivated by covering at least a portion of the magnetic alloy layer with a polyimide layer. The passivated magnetic concentrator is then protected from chemicals such as etchants and cleaning chemicals that are used in subsequent processing steps when forming a semiconductor die including the magnetic concentrator. By forming a passivated magnetic concentrator, use of the arrangements allows conventional semiconductor processing including conventional chemicals to be used without damage to the magnetic alloy layer in the passivated magnetic concentrator.

In the arrangements, a semiconductor die includes one or more Hall sensors. A first passivation layer, such as a polyimide layer, is formed over a surface of the semiconductor die. A seed layer is deposited over the polyimide layer. A photoresist is deposited and patterned to form areas for plating. A magnetic concentrator is formed over the semiconductor die by depositing a magnetic alloy layer in the areas patterned in the photoresist for plating. The deposit can be done using electroplating or by electroless plating. The magnetic alloy layer material is plated on the seed layer in the patterned areas. After the plating process, the photoresist is stripped or otherwise removed, for example, by ashing. A protective layer is formed over the magnetic alloy layers and patterned using photolithography to form a passivated magnetic concentrator. In one arrangement, the sides and top of the magnetic concentrator are covered. By passivating the magnetic alloy layer, the remaining seed layer and any other layers used in the plating process are then removed by conventional seed layer etch and clean processes. Etchants and cleaning solutions such as sulfuric acid, peroxide, ammonia and combinations of these such as piranha solution can be used. Because the magnetic alloy layers are passivated by the protective layer, conventional semiconductor chemicals can be used without damage to the magnetic alloy layers. The magnetic alloy layers and the protective layers form magnetic concentrators. In operation, the magnetic concentrators increase the sensitivity of the Hall sensors to in plane magnetic fields. The materials and methods used in the arrangements are ones often used in semiconductor processing, no new materials are required. The use of the arrangements is cost effective and easy to implement.

Figure 1:
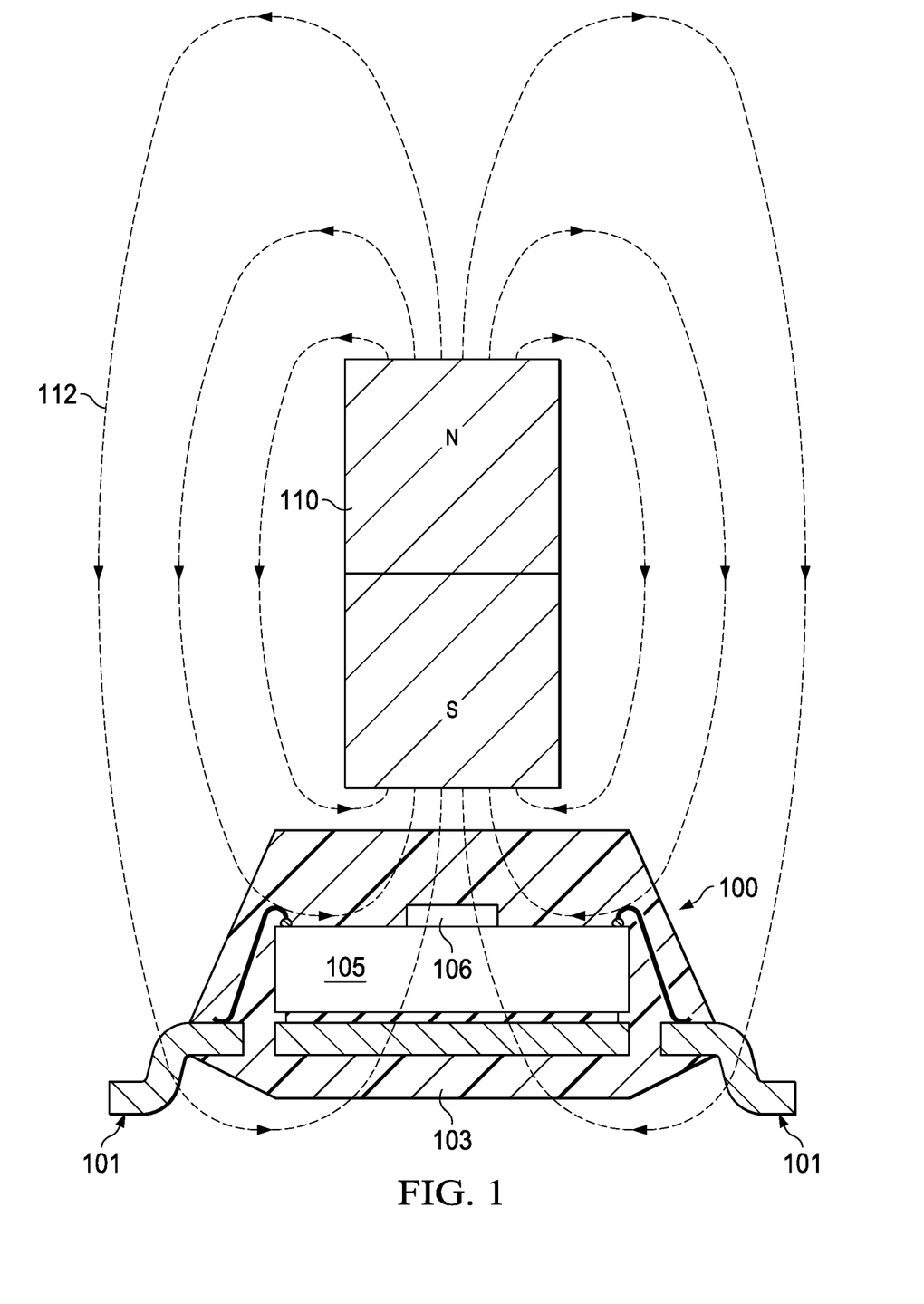
FIG. 1 illustrates in a projection view a Hall sensor semiconductor device in a small outline transistor (SOT) package sensing.

FIG. 1 illustrates, in a cross sectional view, a semiconductor die 105 including a Hall sensor 106 in a semiconductor device package 100, illustrated in an example that is a small outline transistor (SOT) package. SOT packages are one type of semiconductor device package that is useful with the arrangements. SOT packages are used for low terminal count devices including passive components, transistors, and analog circuits. The semiconductor device package 100 has a body formed from a mold compound 103, for example a thermoset epoxy resin. Other mold compounds including resins, epoxies, or plastics can be used. Leads 101 are part of a package substrate such as a metal lead frame that supports a semiconductor die 105 (not visible in FIG. 1, as it is obscured by the package body, see FIG. 2) within the package 100, the leads 101 are exposed from the mold compound 103 and form electrical terminals for the packaged electronic device. In the example SOT package shown., the leads 101 in FIG. 1 are formed to provide gull wing shaped terminals that extend alongside the body of the packaged semiconductor device 100 with a foot portion at the ends. The packaged electronic device 100 can be mounted to a circuit board or module using surface mount technology (SMT).

In FIG. 1, the semiconductor device 100 is shown in a sensing application for a magnetic field 112 due to a source 110. The flux density 112 for a magnetic field is normal to the plane of the Hall sensor, where the sensitivity is greatest. However, the Hall sensor 106 is relatively insensitive to magnetic fields that are in plane with the plane of the Hall sensor.

Figure 2:
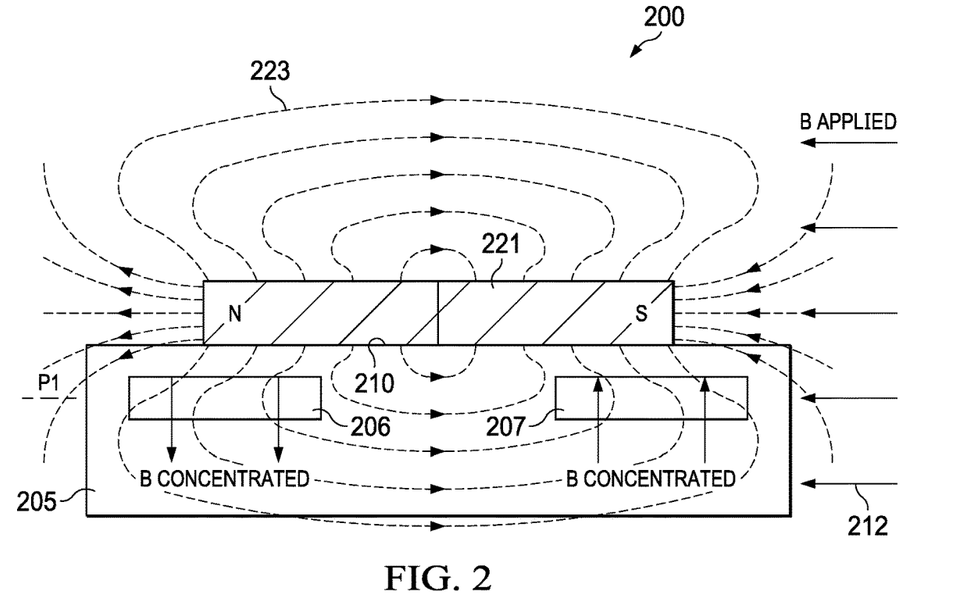
FIG. 2 illustrates a semiconductor die with Hall sensors and a magnetic concentrator in an applied magnetic field.

FIG. 2 illustrates the addition of a magnetic concentrator to a semiconductor die including Hall sensors. In FIG. 2, a semiconductor die 205 includes two Hall sensors 206, 207. In an alternative arrangement, a single Hall sensor can be used, such as in FIG. 1. Using two Hall sensors 206, 207 spaced apart allows a differential magnetic flux sensing approach, where inherent voltage offsets and common mode noise can be reduced in a signal by taking a difference between the outputs of two similar Hall sensors 206, 207, using the difference signal to sense the strength of a magnetic field. The Hall sensors 206 and 207 lie in a plane P1, which is parallel to the device side surface 2 of semiconductor die 205. In FIG. 2, a magnetic concentrator 221 is shown formed over the Hall sensors 206, 207 in semiconductor die 205.

When the magnetic field with flux density 212 is applied in an in plane direction to the Hall sensors 206 and 207, the magnetic concentrator 221 is magnetized and produces a second field with flux lines 223 that has concentrated flux strength in the semiconductor die 205 around the Hall sensors 206, 207 and the magnetic flux is in an out of plane direction for the Hall sensors. In the example, the flux from magnetic field 223 is in a normal direction with respect to the plane P1 the Hall sensors lie in, so that the Hall sensors are sensitive to and will sense the flux of magnetic field 223, which is proportional to the flux of applied magnetic field 212. By adding the magnetic concentrator 221, the semiconductor device 200 can sense in plane magnetic fields. In an example arrangement, the magnetic concentrator 221 can be formed of a magnetic alloy layer deposited over the surface of the semiconductor die 205 and aligned with the Hall sensors 206, 207. In a particular example a nickel iron (NiFe) alloy layer is used. Other magnetic alloy materials can be used, including CoFe, CoFeB, CoNiFe, or CoNiFeCr.

Figure 3:
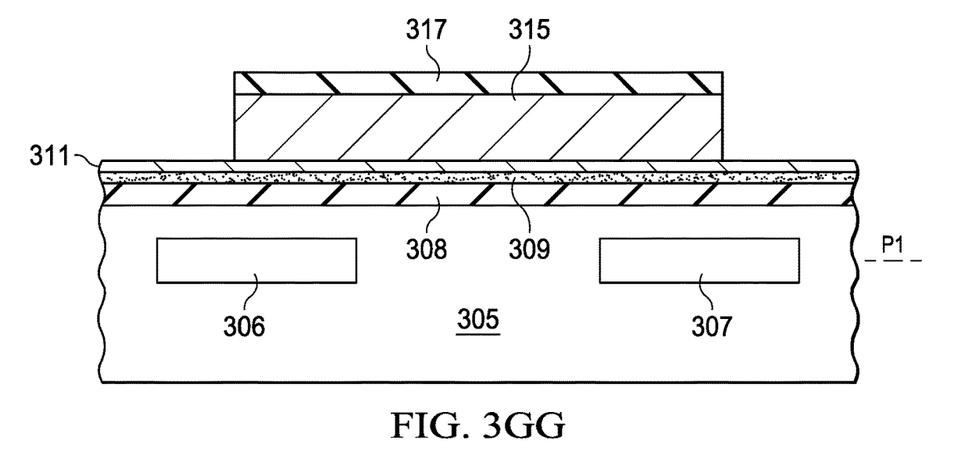
Figure 3A:
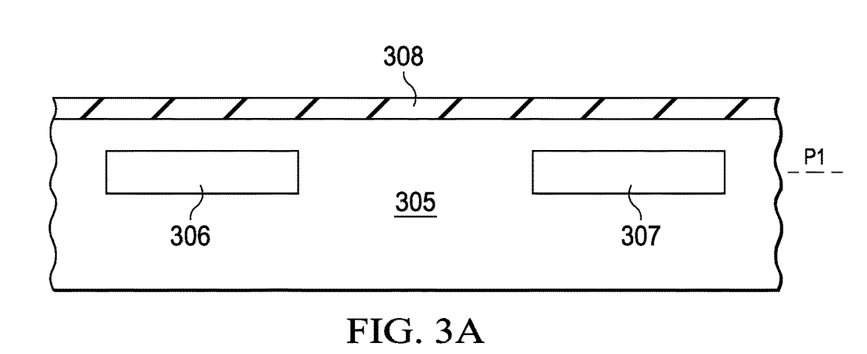
FIGS. 3A-3H, 3GG and 3HH illustrate, in a series of cross sectional views, selected steps for forming a semiconductor die and passivated magnetic concentrator of an arrangement.

FIGS. 3A-3HH illustrate, in a series of cross sections, selected steps used to form arrangements. In FIG. 3A., a semiconductor die 305 is shown in cross section with a pair of Hall sensor devices 306, 307 formed spaced apart within the semiconductor die 305. In an example, a silicon semiconductor die is used and the Hall sensors are formed by doping to form areas with carriers which, when subjected to an applied magnetic field while a constant current is flowing, will output a voltage proportional to the magnetic field. Using a single Hall sensor is possible in an arrangement, however, in the example arrangements illustrated in FIGS. 2 and 3A-3GG, two Hall sensors are used, allowing differential sensing to be used. A layer of polyimide 308 is shown deposited over the device side surface of the semiconductor die 305, which acts as a passivation layer. Additional passivation layers can be used between the semiconductor die 305 and the polyimide layer 308, such as nitrides, oxides, and oxynitride layers. The Hall sensors 306 and 307 lie in a plane P1, which is parallel to the device side surface of the semiconductor die 305.

Figure 3B:
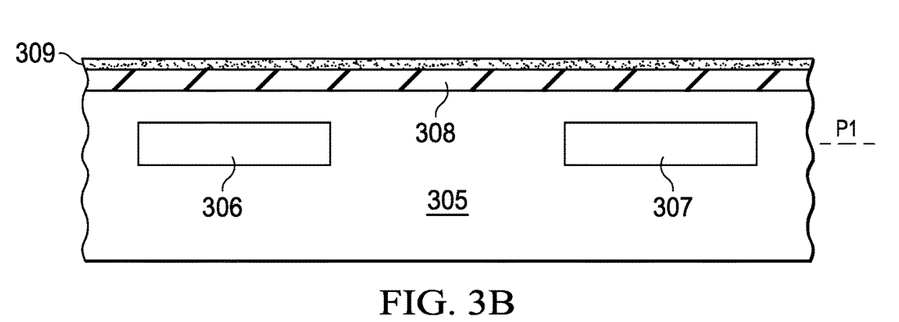

FIG. 3B illustrates the semiconductor die 305 in FIG. 3A after additional processing. In FIG. 3B, an adhesion layer 309 is formed over the polyimide layer 308 to prepare for a plating operation. The adhesion layer 309 can be, in an example process, a TiW layer. Other materials including chromium (Cr), titanium (Ti), tungsten (W) and nickel (Ni) can be used to form an adhesion layer. The adhesion layer enhances adhesion of subsequent metals to be deposited on the structure to the polyimide layer 308. In an alternative approach, the adhesion layer 309 can be omitted.

Figure 3C:
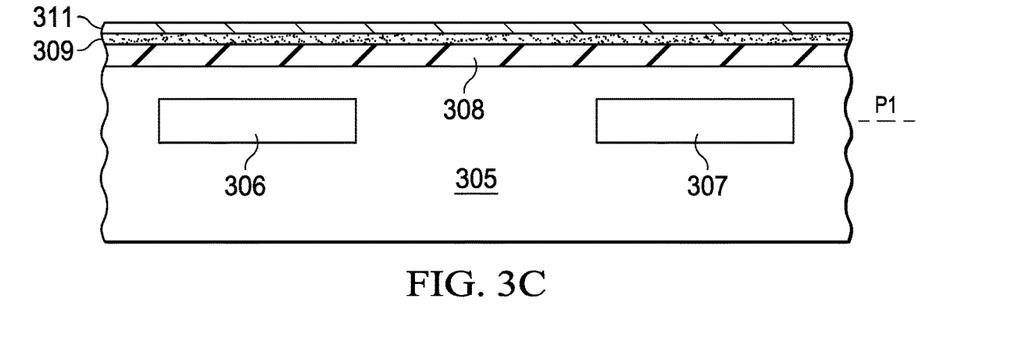

FIG. 3C illustrates the semiconductor die 305 shown in FIG. 3B after additional processing. In FIG. 3C, a seed layer 311 is shown deposited over the adhesion layer 309. In an example process a copper (Cu) seed layer is formed. The seed layer 311 can be sputter deposited over the surface of the semiconductor die 305, for example. Vapor deposition such as CVD, plasma vapor deposition (PVD), and atomic layer deposition (ALD) can be used to form the seed layer 311. In an alternative arrangement, a sputter layer of NiFe can be used as the seed layer 311.

Figure 3D:
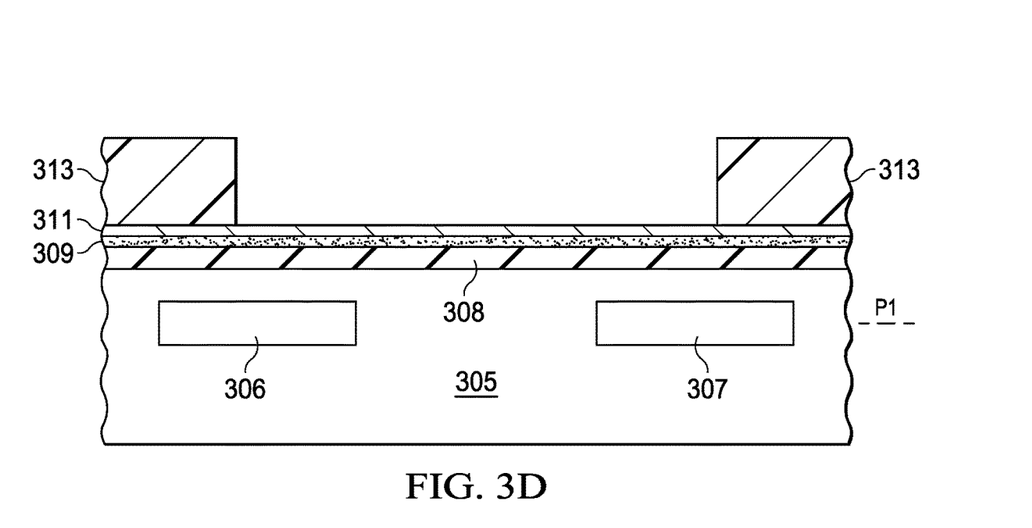

FIG. 3D illustrates in another cross section the semiconductor die 305 of FIG. 3C after additional processing. In FIG. 3D, a photoresist layer 313 is shown after deposition and patterning steps. The photoresist layer 313 defines areas of seed layer 311 that are exposed for plating.

Figure 3E:
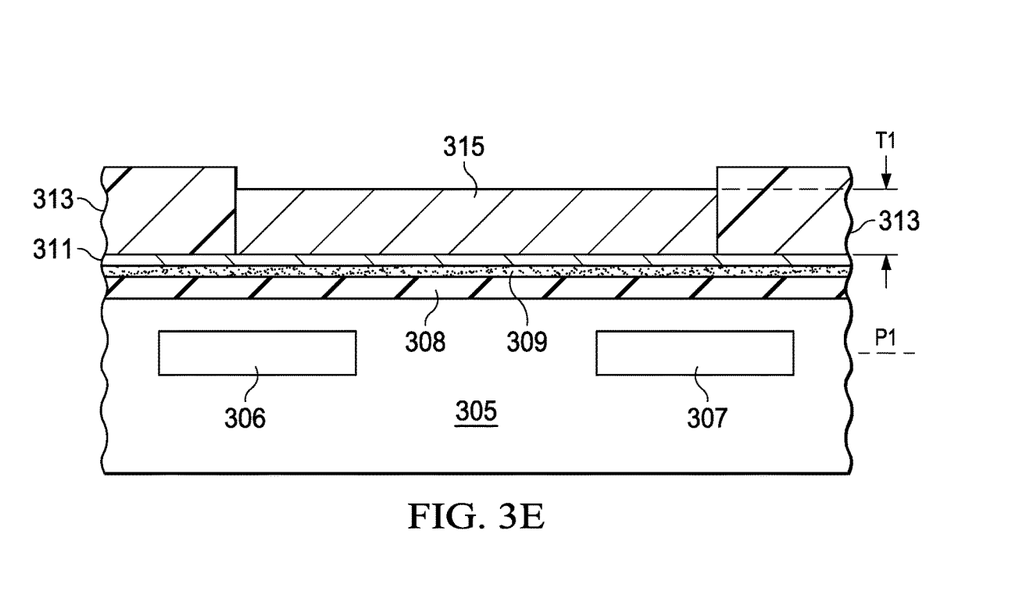

FIG. 3E illustrates, in another cross section, the elements of FIG. 3D after additional processing. In FIG. 3E, a layer 315 of magnetic alloy material is shown after being plated in the open areas defined by the patterned photoresist layer 313. In an example arrangement, the magnetic alloy layer 315 is a nickel iron NiFe composition. In an alternative arrangement, magnetic alloy layers including CoFe, CoFeB, CoNiFe, or CoNiFeCr can be used. In an example process, the magnetic alloy layer 315 has a thickness T1 that is between 10 and 90 microns thick. The magnetic alloy layer can be formed using the seed layer 311 in a plating process such as electroplating or by electroless plating. In an example process, electroplating is performed using a NiFe bath plating chemistry. An anode of Ni is used, current for electroplating is applied to the seed layer 311, and the NiFe layer 315 is formed.

Figure 3F:
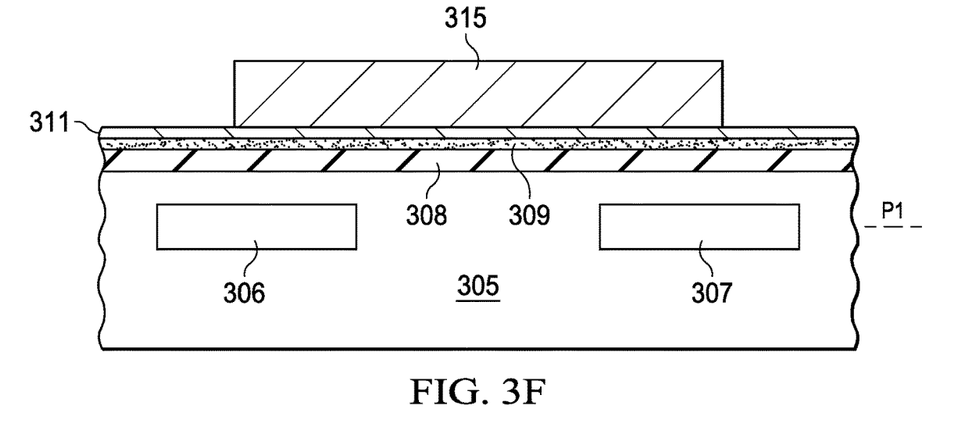

FIG. 3F illustrates, in another cross section, the elements of FIG. 3E after additional processing. In FIG. 3F the magnetic alloy layer 315 is shown after the photoresist layer 313 is removed (see FIG. 3E). The photoresist layer can be removed by a chemical strip or a plasma ashing process, or by a combination of these. The magnetic alloy layer 315 now has exterior side surfaces and a top surface facing away from the device side surface of the semiconductor die 305.

Figure 3G:
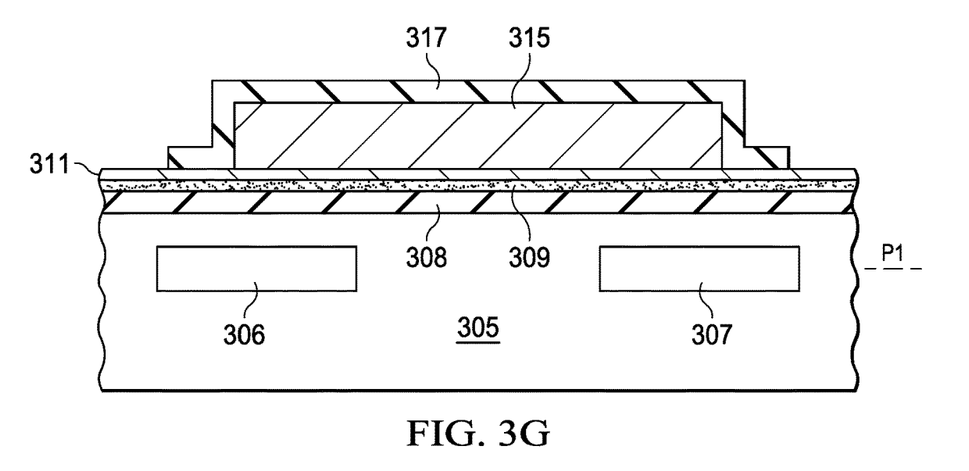

FIGS. 3G and FIG. 3GG illustrate in cross sections two alternative arrangements that result from additional processing of the elements shown in FIG. 3F. In FIG. 3G, another protective layer 317 is deposited over the magnetic alloy layer 315. In FIG. 3G, the protective layer 317 is patterned to cover the top surface of the magnetic alloy layer 315 as well as the exterior side surfaces. The protective layer 317 thus passivates the magnetic alloy layer 315, so that it is protected from additional processes. Useful examples for the protective layer 317 include any patternable protective polymer. In some examples the protective layer 317 is photo-patternable. In some examples polyimide is used for protective layer 317. In a particular example, a polyimide HD4100 was used, this material is commercially available from HD Microsystems, LLC, Parlin, New Jersey, USA.

FIG. 3GG illustrates, in another cross section, an alternative approach. In FIG. 3GG, following the processes that resulted in the structure shown in FIG. 3F, the protective layer 317 is deposited and patterned to cover only the top surface of the magnetic alloy layer 315. The top of magnetic alloy layer 315 is then protected from additional processing by passivation of the protective layer 317.

Figure 3H:
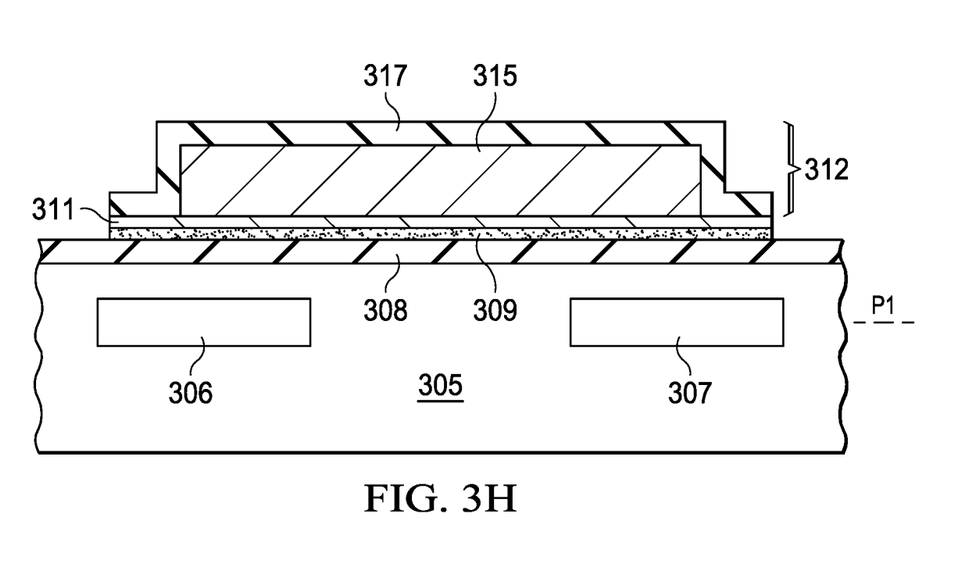

FIG. 3H illustrates in another cross section the elements of FIG. 3G after additional processing. In FIG. 3H, the seed layer 311, and the adhesion layer 309, that lie outside the magnetic alloy layer 315 and are no longer needed, are removed by chemical etch, dry etch or other processes. Chemical wet etchants such as sulfuric acid, peroxide, or ammonia, or combinations of these, can be used. Mixtures such as piranha etch solution can be used. Layer 317 protects the magnetic alloy layer 315 from damage that would otherwise occur during the etch steps. Use of the arrangements, including the protective layer 317 over the magnetic alloy layer 315, allows conventional etch chemistries and materials to be used without damage to the magnetic alloy layer, which is sensitive to these etches. A passivated magnetic concentrator 312 is formed by the protective layer 317 and the magnetic alloy layer 315 over the semiconductor die 305. The passivated magnetic concentrator 312 will, in operation, allow the Hall sensors 306, 307 to sense an applied magnetic field that is an in plane field with respect to the plane P1 that the Hall sensors 306, 307 lie in.

FIG. 3HH illustrates, in another cross section, the alternative arrangement of FIG. 3GG after additional processing. In FIG. 3HH, the seed layer 311 and the adhesion layer 309 are removed from areas outside the magnetic alloy layer 315, where these layers are no longer needed. A passivated magnetic concentrator 314 is formed by the protective layer 317 over the magnetic alloy layer 315 that is formed over the semiconductor die 305. The magnetic concentrator 314 will allow the Hall sensors 306, 307 to sense an applied magnetic field that is an in plane field with respect to the plane P1 that the Hall sensors lie in.

FIGS. 3A-3HH illustrate steps for forming an arrangement using a single semiconductor die 305 as an example. However, in production, these steps are performed on a semiconductor wafer, with many semiconductor dies being formed simultaneously. After the semiconductor dies are formed, additional steps are performed to separate the dies, and to package the dies to form semiconductor devices.

Figure 4A:
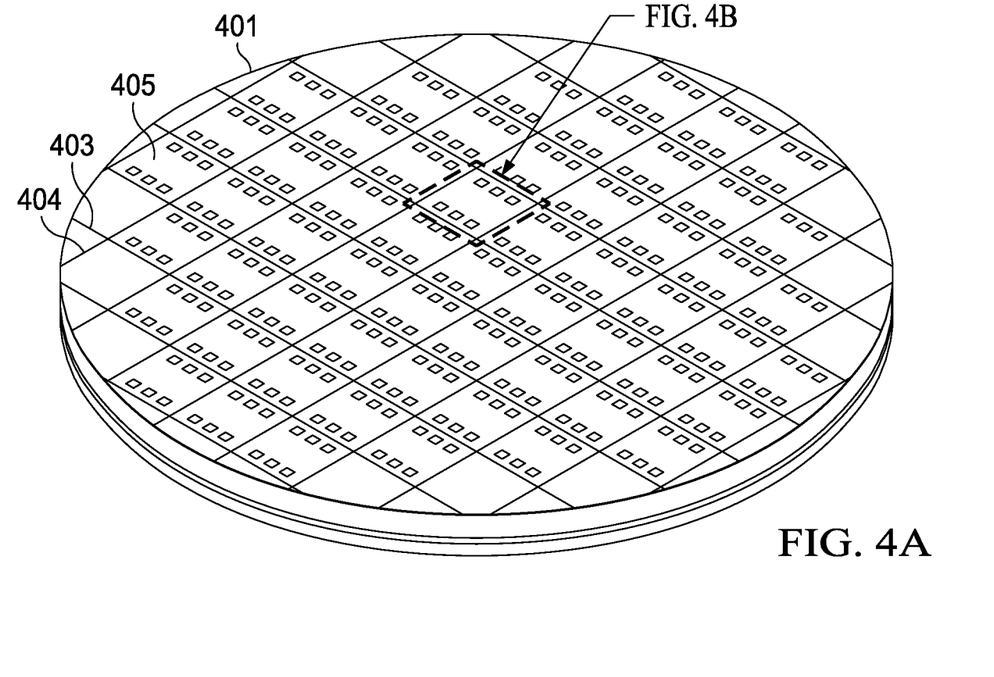
FIGS. 4A-4B illustrate in a projection view and a close up view, respectively, semiconductor dies on a semiconductor wafer and an individual semiconductor die.
Figure 4B:
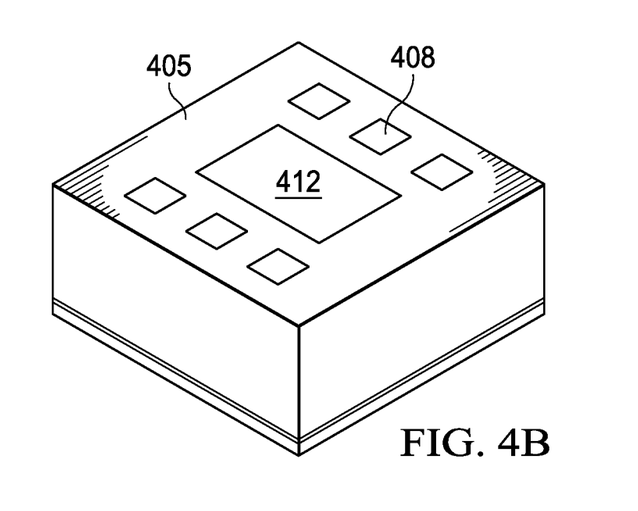

FIGS. 4A-4B illustrate steps used in forming semiconductor dies such as used with the arrangements for wire bonding. In FIG. 4A, a semiconductor wafer 401 is shown with an array of semiconductor dies 405 arranged in rows and columns. The semiconductor dies 405 are formed using manufacturing processes in a semiconductor manufacturing facility, including ion implantation for carrier doping, anneals, oxidation, dielectric and conductor deposition, photolithography, pattern, etch, chemical mechanical polishing (CMP), electroplating, and other processes for making semiconductor devices. Devices are formed on a device side surface of the semiconductor dies. Scribe lanes 403 and 404, which are perpendicular to one another and which run in parallel groups across the wafer 401, separate the rows and columns of the completed semiconductor dies 405, and provide areas for dicing the wafer to separate the semiconductor dies 405 from one another.

FIG. 4B illustrates a single semiconductor die 405, with bond pads 408, which are conductive pads that are electrically coupled to devices (not shown for simplicity) formed in the semiconductor dies 405. The semiconductor dies 405 are separated from wafer 401 by wafer dicing, or are singulated from one another, using the scribe lanes 403, 404 (see FIG. 4A). Wafer dicing can be done by a mechanical saw or by laser cutting along the scribe lanes. The semiconductor die 405 shown in FIG. 4B includes a passivated magnetic concentrator 412 formed over a device side surface of the semiconductor die. The passivated magnetic concentrator 412 can be formed of a magnetic alloy layer and a protective layer as shown in FIGS. 3A-3HH.

Figure 5A:
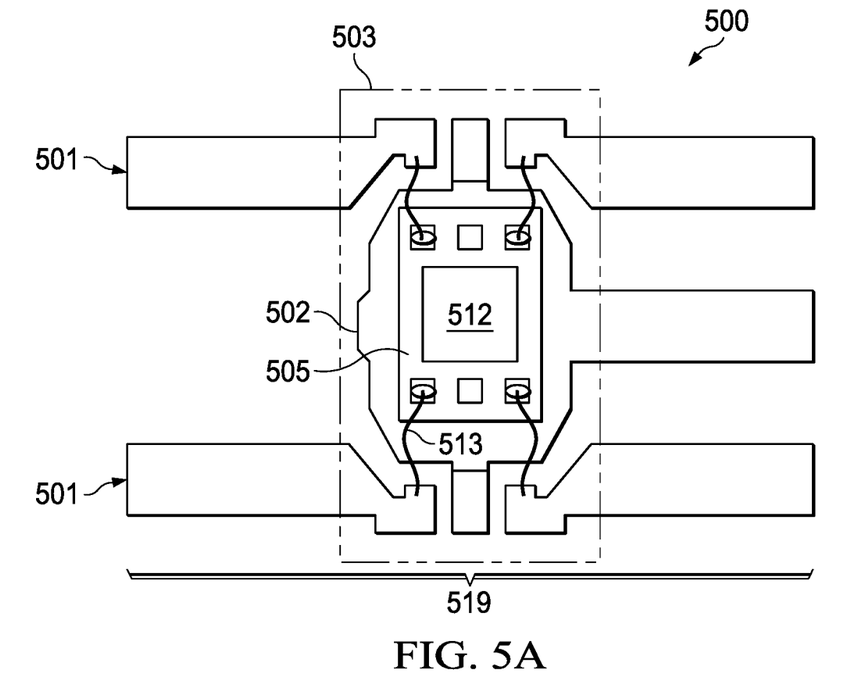
FIGS. 5A-5C illustrate, in a plan view, a projection view, and a cross sectional view, respectively, packaged semiconductor devices of the arrangements.
Figure 5B:
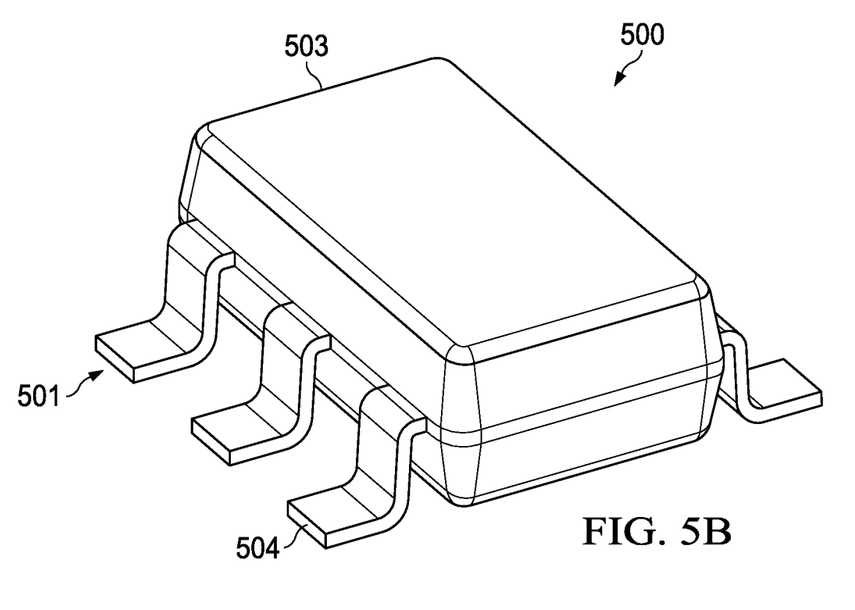
Figure 5C:
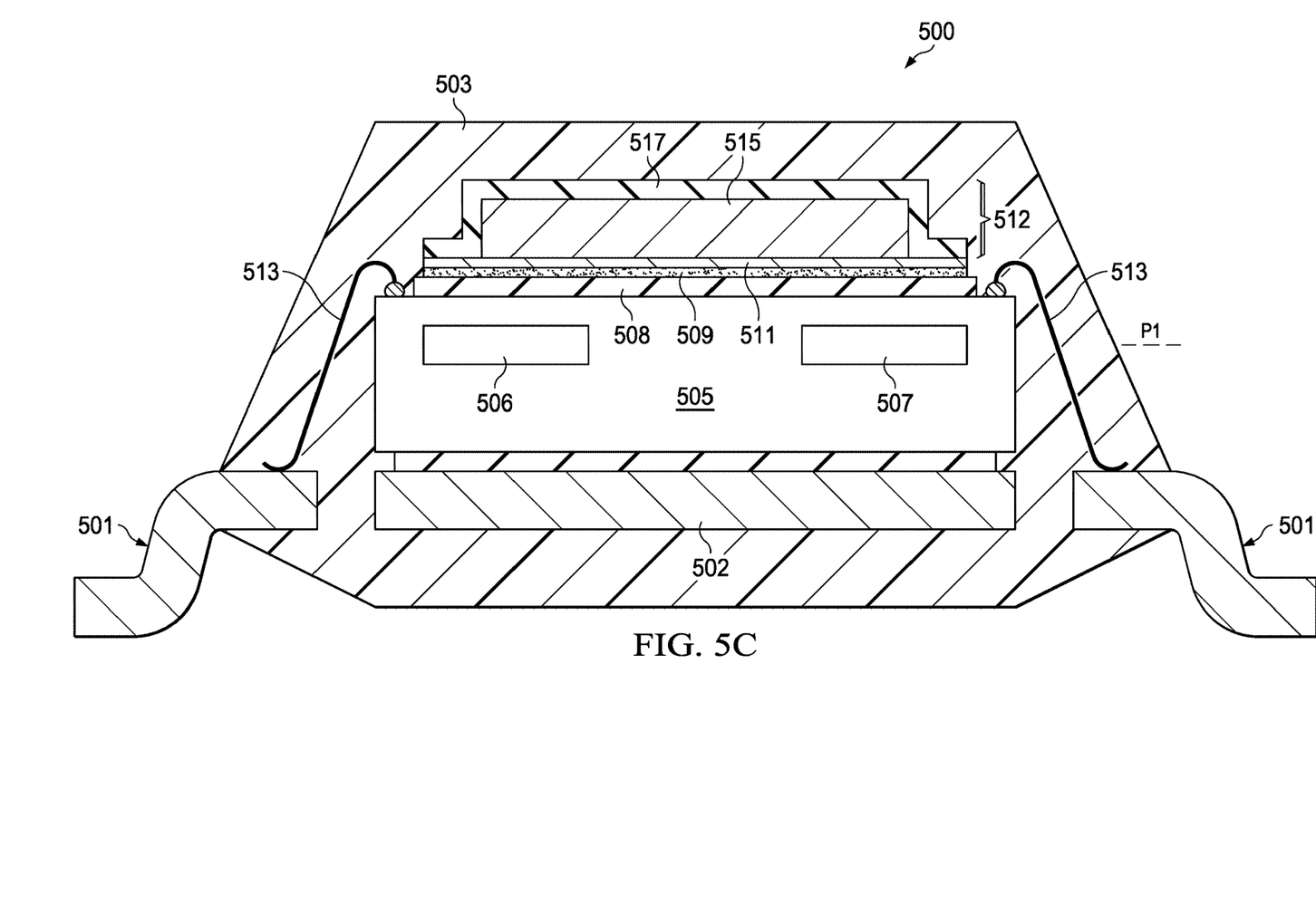

FIGS. 5A-5C illustrate, in a plan view, a projected view, and a cross section, respectively a packaged semiconductor device incorporating an arrangement. FIG. 5A illustrates in a plan view a packaged semiconductor device 500 with a semiconductor die 505 of the arrangements including a passivated magnetic concentrator 512. FIG. 5A illustrates the packaged semiconductor device after mold compound 503 is formed. The metal lead frame is shown with leads 501 and a die pad 502. Note the leads 501 have not yet been formed in a lead forming process, see FIG. 5B which illustrates the finished semiconductor device package. The semiconductor die 505 has a backside surface (not visible) mounted to the die pad 502, with the device side surface of the semiconductor die 505 facing the viewer in the figure. The semiconductor die 505 is electrically connected to leads 501 by wire bonds 513, which couple bond pads on the semiconductor die 505 to the leads 501. A mold compound 503 is shown (illustrated as transparent for the illustration in FIG. 5A) covering the die pad 502, the semiconductor die 505, a portion of the leads 501, with the leads 501 extending through and exposed from the mold compound 503 to form terminals. The portions of the leads 501 that are exposed from the mold compound 503 will be shaped to form the terminals for the semiconductor device package that includes semiconductor die 505, as is further described below. The passivated magnetic concentrator 512 is shown overlying a portion of the semiconductor die 505, which includes one or more Hall sensors formed in the semiconductor die.

FIG. 5A illustrates the elements after molding forms the mold compound 503 and after a trim step removes dam bars and unused leads from the package substrate 519, but prior to a form step to shape the leads 501.

A wire bonding process is used to form the bond wires 513. In wire bonding a wire bonding tool is used that includes a capillary with a bond wire running through it. In useful examples, the bond wire can be copper, palladium coated copper (PCC), gold, silver or aluminum. To begin a wire bond, a "free air" ball is formed on one end of the bond wire as it extends from the capillary. The ball can be formed by a flame or other heating device directed to the end of the wire. The ball is placed on a conductive bond pad of a semiconductor die and the ball is bonded to the bond pad. Heat, mechanical pressure, and/or sonic energy can be applied to bond the ball to the bond pad. As the capillary moves away from the ball bond on the bond pad, the bond wire extends from the capillary in an arc or curved shape. The capillary moves over a conductive portion of a package substrate, for example a spot on a lead of a lead frame. The capillary in the wire bonder is used to bond the bond wire to the conductive lead, for example a stitch bond can be formed between the bond wire and the lead. After the stitch bond is formed to the conductive lead, the wire extending from the stitch bond is cut or broken at the capillary end, and the process starts again by forming another ball on the wire. Automated wire bonders can repeat this process very rapidly, many times per second, to form bond wires for the packaged semiconductor device. This process is referred to as "ball and stitch" bonding. In an alternative, a ball is first bonded to a package substrate lead or other conductive surface. A second ball is formed on the end of the bond wire, and bonded to a bond pad on the semiconductor die. The bond wire is then extended to the first ball, and bonded to the first ball with a stitch bond on the ball, this is sometimes referred to as "ball stitch on ball" or "BSOB" bonding. In some example processes, the ball bonds are more reliable than stitch bonds made to the package substrate, and the use of the extra ball bonds can increase the wire bond reliability.

FIG. 5B illustrates, in a projection view, the packaged semiconductor device of FIG. 5A. In this example an SOT package is shown. Packaged semiconductor device 500 includes mold compound 503 covering the semiconductor die 505, die pad 502 of the metal lead frame, and a portion of the leads 501. Leads 501 extend from the mold compound 503, and the exposed portions are shaped to form terminals for the packaged device with feet portions 504 arranged for surface mounting the packaged semiconductor device 500 to a circuit board. In alternative arrangements, a no lead package, such as a small outline no lead (SON) package can be used, a quad flat no lead (QFN) package can be used. In no lead packages, the terminals do not extend beyond the package outline, so that leads 501 would not be as shown in FIG. 5B, instead portions of the leads would end with the package body and have a bottom surface exposed from the mold compound for mounting to a circuit board.

FIG. 5C illustrates, in a cross sectional view, the packaged semiconductor device of FIGS. 5A-5B illustrating an example arrangement. In FIG. the packaged semiconductor device 500 includes a semiconductor die 505 with two Hall sensors 506, 507 formed in the semiconductor die 505. As shown, the two Hall sensors are formed in a plane P1, which is oriented horizontally as the elements are oriented in FIG. 5C, and is parallel to a device side surface of the semiconductor die 505. A polyimide layer 508 is shown deposited over the device side surface of the semiconductor 505. A seed layer 511 is shown deposited over the polyimide layer 508. In the example arrangement, an adhesion layer 509 is also deposited over the polyimide layer 508, and between the seed layer 511 and the polyimide layer 508. In an example process, the adhesion layer can be a TiW layer, other materials used for adhesion layers in semiconductor processes can be used, such as titanium (Ti), tungsten (W), and nickel (Ni). In an alternative approach the adhesion layer 509 can be omitted. The seed layer 511, in an example process, is copper. The seed layer can be deposited by sputter deposition, or by atomic layer deposition (ALD). A magnetic alloy layer 515 is formed on the seed layer using plating processes such as electroless and electroplating processes with photoresist and photolithography. A protective layer 517 is formed over the magnetic alloy layer 515. As described above, the protective layer 517 can be any patternable polymer, a polyimide, or a photo-patternable polymer. Use of the protective layer 517 in the arrangements enables the magnetic alloy layer 515 to be protected from other processing steps and chemicals used after the plating operations without damage to the magnetic alloy layer 515. The magnetic alloy layer 515 and the protective layer 517 form a passivated magnetic concentrator 512, which, as described above, in operation of the packaged semiconductor device 500, enables the Hall sensors 506, 507 to sense applied magnetic fields that are in plane fields with respect to the plane P1, the magnetic alloy layer 515 responding to an applied magnetic field by forming a local magnetic field and bending field lines of the local field to be an out of plane field with respect to the plane P1. As described above and illustrated in FIG. 2, the Hall sensors in the packaged semiconductor device 500 can sense an in plane applied magnetic field when the arrangements are used.

Figure 6A:
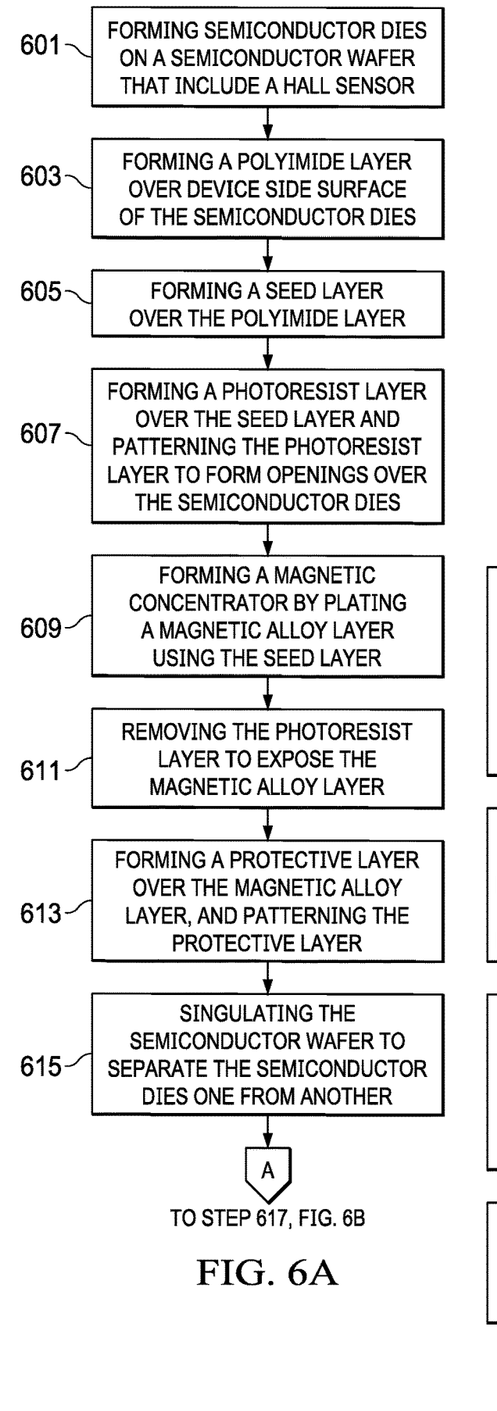
FIGS. 6A-6B illustrate in a flow diagram selected steps of a method for forming the arrangements.
Figure 6B:
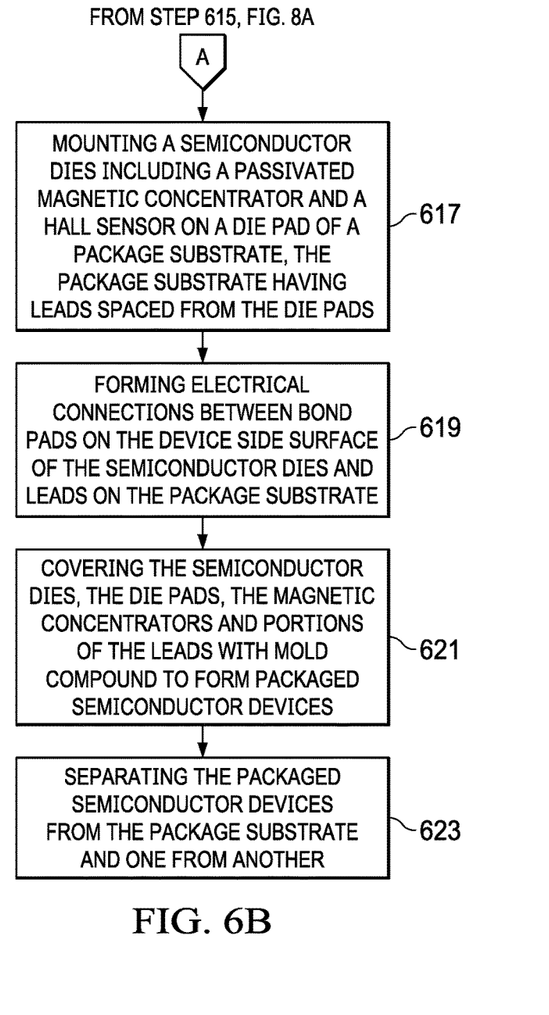

FIGS. 6A-6B illustrate, in flow diagrams, steps for forming a semiconductor device package of the arrangements. In the flow diagram of FIG. 6A, processing for a single semiconductor die is described for explanation. In a production run, the package substrate will have many semiconductor dies mounted to unit lead frame portions, the wire bonding and molding operations are performed on all of the unit devices contemporaneously to increase yield and reduce costs of manufacturing.

FIG. 6A illustrates the steps performed to form arrangements in wafer level processing. FIG. 6B then illustrates the steps performed to form the arrangements after the semiconductor dies are removed from the wafer, and are being packaged.

At step 601 in FIG. 6A, the method begins with forming semiconductor dies on a semiconductor wafer, the semiconductor dies include at least one Hall sensor, and alternatively, can include two or more Hall sensors.

The method transitions to step 603 in FIG. 6A, where a first polyimide layer is formed over the device side surface of the semiconductor dies.

The method then transitions to step 605 in FIG. 6A, where a seed layer is formed over the first polyimide layer over the semiconductor dies. In an example process, an adhesive layer, such as a TiW layer, is formed between the seed layer and the first polyimide layer. In an alternative process, the adhesive layer is omitted. The seed layer can be of copper, for example.

The method then transitions to step 607, a photoresist layer is formed over the seed layer, and the photoresist layer is patterned to form openings for plating.

The method of FIG. 6A next transitions to step 609, where a magnetic concentrator is formed by plating a magnetic alloy layer using the seed layer. The magnetic alloy layer can be plated by an electroplating or electroless plating process. The magnetic alloy layer can be a nickel iron NiFe layer. In additional useful examples, the magnetic alloy layer can be a cobalt iron CoFe layer, a cobalt nickel iron layer CoNiFe, and magnetic alloys including CoFeB and CoNiFeCr.

The method of FIG. 6A then transitions to step 611, where a photoresist stripping process removes the photoresist layer. A plasma ashing process or other stripping process can be used.

The method of FIG. 6A then transitions to step 613, where a protective layer is formed over the magnetic alloy layer. The protective layer is patterned to cover a portion of the magnetic alloy layer. The protective layer can be a patternable polymer, a photo-patternable polymer, or a polyimide. In one example, the upper surface of the magnetic alloy layer is covered. In an alternative example, the upper surface of the magnetic alloy layer is covered, and the exterior sides are covered by the protective layer. The protective layer is then processed by removing the unneeded portions of the seed layer, and the adhesion layer if one was used.

At step 615, the semiconductor wafer is singulated, and the individual semiconductor dies are removed one from another. An example is shown in FIGS. 4A-4B. This completes the wafer level processes for the arrangements, and the method then transitions to the die packaging operations shown in FIG. 6B, the method transitions from step 615 in FIG. 6A to step 617 in FIG. 6B.

The die packaging operations are shown in FIG. 6B. The method transitions from step 615 in FIG. 6A to step 617, in FIG. 6B. In step 617, semiconductor dies are mounted on a die pad of a package substrate, the package substrate has leads spaced from the die pads for each semiconductor die. At step 619, in FIG. 6B, electrical connections are formed between bond pads on a semiconductor die and leads on spaced from the semiconductor die on the package substrate. The electrical connections can be bond wires as shown in FIG. 5A, or in an alternative arrangement, ribbon bonds can be used.

The method continues at step 621. At step 621 a molding operation covers the semiconductor dies, the die pads, the magnetic concentrators, and portions of the leads, with mold compound to form packaged semiconductor devices.

At step 623 the packaged semiconductor devices are removed from the package substrate and separated from one another by a sawing operation. A mechanical saw cuts through the package substrate, which can be a metal lead frame, and the mold compound, in saw streets between the packaged semiconductor devices to separate them one from another.

The use of the arrangements provides a packaged semiconductor device including one or more Hall sensors with passivated magnetic concentrators. The packaged semiconductor devices are sensors that are sensitive to magnetic fields including in plane magnetic fields. The arrangements are formed using existing methods, materials and tooling for making the devices and are cost effective. By providing the passivated magnetic concentrators over the semiconductor device dies, using materials that are compatible with typical semiconductor process chemistries and methods, the use of the arrangements provides an economical Hall sensor device that is sensitive to in plane magnetic fields. The packaged semiconductor devices can be used with a variety of semiconductor package types, including SOT and SON packages.

Modifications are possible in the described arrangements, and other alternative arrangements are possible within the scope of the claims.

What is claimed is:

1. An apparatus, comprising:
a semiconductor die comprising a Hall sensor arranged in a first plane that is parallel to a device side surface of the semiconductor die;
a passivated magnetic concentrator comprising a magnetic alloy layer formed over the device side surface of the semiconductor die having an upper surface facing away from the device side surface of the semiconductor die, the upper surface of the magnetic alloy layer covered by a layer of polymer material, wherein the device side surface of the semiconductor die includes an area uncovered by a footprint of the layer of polymer material;
a backside surface of the semiconductor die opposite the device side surface mounted to a die side surface of a die pad on a package substrate, the semiconductor die having bond pads on the device side surface spaced from the passivated magnetic concentrator;
electrical connections coupling the bond pads of the semiconductor die to leads of the package substrate; and
a mold compound covering the passivated magnetic concentrator, the semiconductor die, the electrical connections, a portion of the leads, and the die side surface of the die pad.

2. The apparatus of claim 1, wherein the magnetic alloy layer in the passivated magnetic concentrator comprises nickel iron.

3. The apparatus of claim 1, wherein the magnetic alloy layer in the passivated magnetic concentrator comprises nickel iron, cobalt iron, cobalt iron boron, cobalt nickel iron, cobalt nickel iron chromium or a combination thereof.

4. The apparatus of claim 1, wherein the layer of polymer material covers exterior sides of the magnetic alloy layer.

5. The apparatus of claim 1, wherein the semiconductor die further comprises:
a seed layer disposed between the device side surface of the semiconductor die and the passivated magnetic concentrator.

6. The apparatus of claim 5, wherein the seed layer includes copper or nickel iron.

7. The apparatus of claim 1, wherein the layer of polymer material covers exterior sides of the magnetic alloy layer, and a portion of the device side surface of the semiconductor die.

8. The apparatus of claim 7, wherein the magnetic alloy layer is nickel iron or cobalt iron.

9. The apparatus of claim 8, wherein the magnetic alloy layer has a thickness of between 10 and 90 microns.

10. An apparatus, comprising:
a semiconductor die including at least one Hall sensor formed within the semiconductor die, the at least one Hall sensor arranged along a first plane that is parallel to a device side surface of the semiconductor die; and
a passivated magnetic concentrator over the device side surface of the semiconductor die and over the at least one Hall sensor, the passivated magnetic concentrator comprising a magnetic alloy layer and a layer of polymer material over at least an upper surface of the magnetic alloy layer, the upper surface of the magnetic alloy layer facing away from the device side surface of the semiconductor die, wherein the device side surface of the semiconductor die includes an area uncovered by a footprint of the layer of polymer material.

11. The apparatus of claim 10, wherein the passivated magnetic concentrator comprises the magnetic alloy layer that is nickel iron, cobalt iron, cobalt iron boron, cobalt nickel iron, cobalt nickel iron chromium, or a combination thereof.

12. The apparatus of claim 10, wherein the layer of polymer material covers exterior sides between the upper surface of the magnetic alloy layer an opposing bottom surface disposed over the device side surface of the semiconductor die, wherein the layer of polymer further lies over a portion of the device side surface of the semiconductor die that is adjacent the exterior sides of the magnetic alloy layer.

13. The apparatus of claim 10, wherein magnetic alloy layer includes nickel iron.

14. The apparatus of claim 10, the magnetic alloy layer has a thickness of between 10 and 90 microns.

15. A method, comprising:
forming semiconductor dies on a semiconductor wafer, the semiconductor dies including at least one Hall sensor, the at least one Hall sensor being arranged along a plane that is parallel to a device side surface of the semiconductor dies;
depositing a layer of polyimide material over the device side surface of the semiconductor dies;
depositing a seed layer over the first layer of polyimide material;
depositing a photoresist layer over the seed layer;
patterning the photoresist layer to form openings exposing the seed layer over the device side surface of the semiconductor dies; and
forming passivated magnetic concentrators over the device side surface of the semiconductor dies by performing:
plating a layer of magnetic alloy in the openings;
removing the photoresist layer, the layer of magnetic alloy having an upper surface facing away from the device side surface of the semiconductor dies, and having exterior sides extending from the upper surface to an opposing bottom surface that is over the device side surface of the semiconductor dies; and
forming a second layer of polymer material over the layer of magnetic alloy, the second layer of polymer material covering at least the upper surface of the layer of magnetic alloy.

16. The method of claim 15, wherein the forming the second layer of polymer material over the layer of magnetic alloy further comprises:
covering the exterior sides of the layer of magnetic alloy with the second layer of polymer material.

17. The method of claim 15, wherein plating the layer of magnetic alloy further comprises plating nickel iron, cobalt iron, cobalt iron boron, cobalt nickel iron, cobalt nickel iron chromium, or a combination thereof.

18. The method of claim 15, wherein plating the layer of magnetic alloy layer further comprises plating nickel iron.

19. The method of claim 15, and further comprising, after forming the second layer of polymer material, removing portions of the seed layer not covered by the second layer of polymer material from the device side surface of the semiconductor dies.

20. The method of claim 19, further comprising:
separating the semiconductor dies from the semiconductor wafer;
mounting at least one of the semiconductor dies to a die pad of a package substrate, the package substrate further comprising leads spaced from the die pad;
forming electrical connections between bond pads on the device side surface of the at least one semiconductor die and the leads; and covering the at least one semiconductor die, the passivated magnetic concentrator, the electrical connections, and the die pad with a mold compound, portions of the leads being exposed from the mold compound.

21. A method of sensing a magnetic field, comprising:

placing a packaged semiconductor device comprising a semiconductor die including at least one Hall sensor that lies in a plane in an applied magnetic field, the applied magnetic field being an in plane magnetic field with respect to the plane that the at least one Hall sensor lies in; and sensing the applied magnetic field using a passivated magnetic concentrator in the packaged semiconductor device, the passivated magnetic concentrator comprising a magnetic alloy layer over a device side surface of the semiconductor die, the magnetic alloy layer at least partially covered by a polymer layer, wherein the device side surface of the semiconductor die includes an area uncovered by a footprint of the polymer layer.

22. The method of claim 21, wherein the magnetic alloy layer includes nickel iron, cobalt iron, cobalt iron boron, cobalt nickel iron, cobalt nickel iron chromium, or a combination thereof.

* * * * *